United States Patent
Garrec et al.

(10) Patent No.: US 10,649,068 B2
(45) Date of Patent: May 12, 2020

(54) METHOD FOR MODULATING A MICROWAVE FREQUENCY WAVE, TRANSMISSION SYSTEM CARRYING OUT THIS METHOD, AND RADAR COMPRISING A SYSTEM OF THIS TYPE

(71) Applicant: THALES, Courbevoie (FR)

(72) Inventors: Patrick Garrec, Pessac (FR); Jean-Michel Hode, Pessac (FR); Richard Montigny, Pessac (FR)

(73) Assignee: THALES, Courbevoie (FR)

( * ) Notice: Subject to any disclaimer, the term of this patent is extended or adjusted under 35 U.S.C. 154(b) by 281 days.

(21) Appl. No.: 15/691,544

(22) Filed: Aug. 30, 2017

(65) Prior Publication Data

US 2018/0088210 A1 Mar. 29, 2018

(30) Foreign Application Priority Data

Sep. 29, 2016 (FR) .................................... 16 01422

(51) Int. Cl.
| | | |
|---|---|---|
| *G01S 7/282* | (2006.01) | |
| *G01S 7/03* | (2006.01) | |
| *H03K 3/00* | (2006.01) | |
| *H03C 3/08* | (2006.01) | |
| *H03K 5/04* | (2006.01) | |
| *G01S 7/02* | (2006.01) | |

(52) U.S. Cl.
CPC ............. *G01S 7/282* (2013.01); *G01S 7/023* (2013.01); *G01S 7/032* (2013.01); *H03C 3/08* (2013.01); *H03K 3/00* (2013.01); *H03K 5/04* (2013.01)

(58) Field of Classification Search
CPC ................................ G01S 7/282; G01S 7/023
USPC .......................................................... 342/22
See application file for complete search history.

(56) References Cited

U.S. PATENT DOCUMENTS

| | | | | |
|---|---|---|---|---|
| 5,847,677 A | * | 12/1998 | McCorkle | G01S 13/222 342/204 |
| 7,148,836 B2 | * | 12/2006 | Romero | A61B 5/0507 342/22 |
| 8,199,048 B1 | * | 6/2012 | Medina Sanchez | G01S 7/4004 342/174 |
| 2005/0046609 A1 | | 3/2005 | Wasiewicz | |
| 2011/0140952 A1 | * | 6/2011 | Kemkemian | G01S 13/933 342/146 |

(Continued)

FOREIGN PATENT DOCUMENTS

WO 01/18559 A1 3/2001

OTHER PUBLICATIONS

H. Faust et al., "A spectrally clean transmitting system for solid state phased-array radars," 2004 Proceedings of the IEEE Radar Conference, Apr. 26, 2004, pp. 140-144, XP010711546.

*Primary Examiner* — Marcus E Windrich
(74) *Attorney, Agent, or Firm* — Baker & Hostetler LLP

(57) ABSTRACT

A wave transmitted by an antenna made up of an array of radiating elements, two pulse waves are transmitted, each modulated by a phase shift law known as modulation phase shift, the phase shifts being in opposition, a first wave being transmitted by a sub-array of radiating elements referred to as odd and the second wave being transmitted by a second sub-array of radiating elements referred to as even, the two sub-arrays being interleaved, the transmitted wave being the combination of the first wave and the second wave.

12 Claims, 3 Drawing Sheets

(56) References Cited

U.S. PATENT DOCUMENTS

| | | | |
|---|---|---|---|
| 2011/0221625 A1* | 9/2011 | Cornic | G01S 13/4463 |
| | | | 342/29 |
| 2014/0225761 A1* | 8/2014 | Garrec | G01S 13/74 |
| | | | 342/33 |
| 2015/0061928 A1* | 3/2015 | Cornic | G01S 13/343 |
| | | | 342/25 R |
| 2016/0131754 A1* | 5/2016 | Cornic | G01S 13/4454 |
| | | | 342/156 |

* cited by examiner

METHOD FOR MODULATING A MICROWAVE FREQUENCY WAVE, TRANSMISSION SYSTEM CARRYING OUT THIS METHOD, AND RADAR COMPRISING A SYSTEM OF THIS TYPE

CROSS-REFERENCE TO RELATED APPLICATIONS

This application claims priority to foreign French patent application No. FR 1601422, filed on Sep. 29, 2016, the disclosure of which is incorporated by reference in its entirety.

FIELD OF THE INVENTION

The present invention relates to a method for modulating a microwave frequency pulse wave. The invention also relates to a transmission system carrying out this method, and a radar comprising a system of this type. It applies, in particular, to the field of flat or conformal active antennas, fitted to radar or telecommunications systems.

BACKGROUND

These systems must increasingly comply with spurious emission standards. In fact, with the sharing of the radiation spectrum between the different civil and military domains, it has become crucial not to interfere with the adjacent frequency bands.

Compliance with these standards is a problem, particularly for solid-state transmission systems comprising transmitters based on microwave frequency transistors or microwave frequency transistor modules. In fact, these transistors are current-switched or voltage-switched to create the microwave frequency transmission pulses, and the switched edges generate spurious emissions.

A known solution for pulse radars is to flatten the temporal edges in order to obtain a pulse with soft edges on the rising edge and falling edge in order to substantially reduce transmission spectrum congestion. The theory shows that square pulses cause sinc harmonics. With the former travelling-wave tube radars, the rising and falling edges of the pulse were modelled in a pseudo-Gaussian manner by using, for example, variable capacitances in the modulator.

When microwave frequency transistors are used, the energizing of these elements often causes increased amplitude oscillation which is highly detrimental and which is not controllable.

One of the known solutions is to modulate the power supply of the microwave frequency transistor during transmission. One disadvantage of this solution is that it creates strong currents for very short periods of time. Highly sophisticated power supply controls and a substantial amount of electronics are therefore needed. Microwave frequency power transistors often operate in class C. The modulation of their power supply voltage, if it is possible, is not guaranteed by the manufacturer. Furthermore, due to the decoupling capacitances of the transistors, the modulation of the power supplies on the falling edge is difficult to control.

The other known solutions use the linear amplification zone for the amplitude modulation of the pulse. This modulation is performed by modulating the level of the driving signal of the microwave frequency transistors within the limit of their linear operation.

These solutions are limited to the linear zone of the transistors and do not allow the waveforms to be optimized. They impose a linearity on the entire chain from the waveform generation to the amplification. Furthermore, efficiency is lower in this case and these modulations often cause a heat dissipation which takes place in the components or loads.

SUMMARY OF THE INVENTION

One object of the invention is to overcome these disadvantages and, in particular, to overcome the constraints linked with the linearity requirement.

For this purpose, the subject-matter of the invention is a method for modulating a microwave frequency pulse wave in which, the wave being transmitted by means of an antenna made up of an array of radiating elements, two pulse waves are transmitted, each modulated by a phase shift law known as modulation phase shift, the phase shifts being in opposition, a first wave being transmitted by a sub-array of radiating elements referred to as odd and the second wave being transmitted by a second sub-array of radiating elements referred to as even, the two sub-arrays being interleaved, the transmitted wave being the combination of said first wave and said second wave.

In one possible embodiment, said two waves are obtained from the same pulse signal s(t), said signal being modulated by a first modulation phase shift for the odd radiating elements and by a second modulation phase shift for the even elements.

For each radiating element, a pointing phase shift $\varphi_P$, specific to each radiating element, is added to the modulation phase shift.

In one possible embodiment:

said first modulation phase shift is applied to the rising edge of the pulse by varying from $-\pi/2$ to 0 and to the falling edge by varying from 0 to $-\pi/2$;

said second modulation phase shift is applied to the rising edge of the pulse by varying from $\pi/2$ to 0 and to the falling edge by varying from 0 to $\pi/2$.

A transmission and reception module being connected to each radiating element, said module comprising a phase shifter applying said pointing phase shift, said phase shifter furthermore applies, for example, the modulation phase shift.

A Hamming weighting is, for example, applied to said pulse waves.

In another possible embodiment, a Gaussian Hann weighting is applied to said pulse waves.

The subject-matter of the invention is also a transmission system carrying out the method as previously described.

In one possible embodiment, a transmission and reception module being connected to each radiating element, said module comprising a phase shifter applying a phase shift controlled by a control circuit to the input signal (st)), said modulation phase shift laws are stored in the form of samples in a memory, said phase shift samples being supplied to said control circuit at the frequency of a clock.

Said input signal s(t) is, for example, supplied by a waveform generator common to all of the radiating elements.

For each radiating element, an adder summates, for example, the phase shift samples delivered by said memory with the pointing phase shift $\varphi_P$, the resulting phase shift being supplied to said control circuit.

The subject-matter of the invention is also a radar comprising a system of this type.

BRIEF DESCRIPTION OF THE DRAWINGS

Other characteristics and advantages of the invention will become evident from the description which follows, given with reference to the attached drawings, in which.

DETAILED DESCRIPTION

Figure 1:
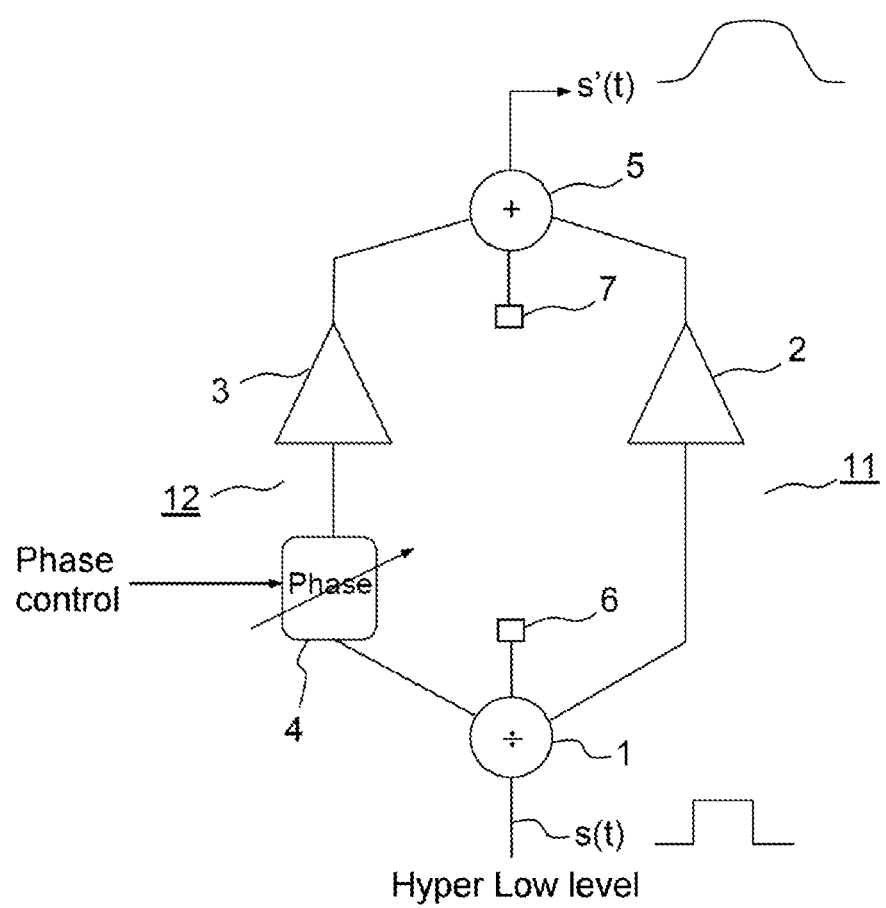
FIG. 1 shows the implementation principle for an amplitude modulator according to the prior art.

FIG. 1 shows the implementation principle for an amplitude modulator according to the prior art. A low-level, steep-edged pulse signal s(t) enters a divider 1 which divides into two branches 11, 12. The first branch 11 comprises a power amplifier 2 amplifying the part of the signal s(t) passing through this branch. The second branch 12 also comprises a power amplifier 3, but also a phase shifter 4 controllable by a phase control signal. The part of the signal s(t) passing through this branch is therefore amplified and phase-shifted, the applied phase shift being controllable. The power amplifiers 2, 3 are amplification modules and more generally transmission/reception modules, also referred to as TR modules. Their amplification function is considered here.

The two branches 11, 12 are connected to a summer 5 in such a way that the signal parts originating from these branches are combined inside this summer. The reconstructed power signal s'(t) at the output of the summer is modelled in the sense that it has smoothed edges as a result of the phase shift 4. The applied phase shift is, for example, equal to $\pi/2$. The signal amplified and modelled in this way is radiated via an antenna having radiating elements.

The summation is carried out by an annular device, formed from the two branches 11, 12. The losses linked to the pulse modelling are dissipated in the components and in the loads 6, 7. They are involved in the heating and require a substantial cooling.

They have a low output and cause a strong heat dissipation in the load of the summer and therefore inside the equipment.

Figure 2:
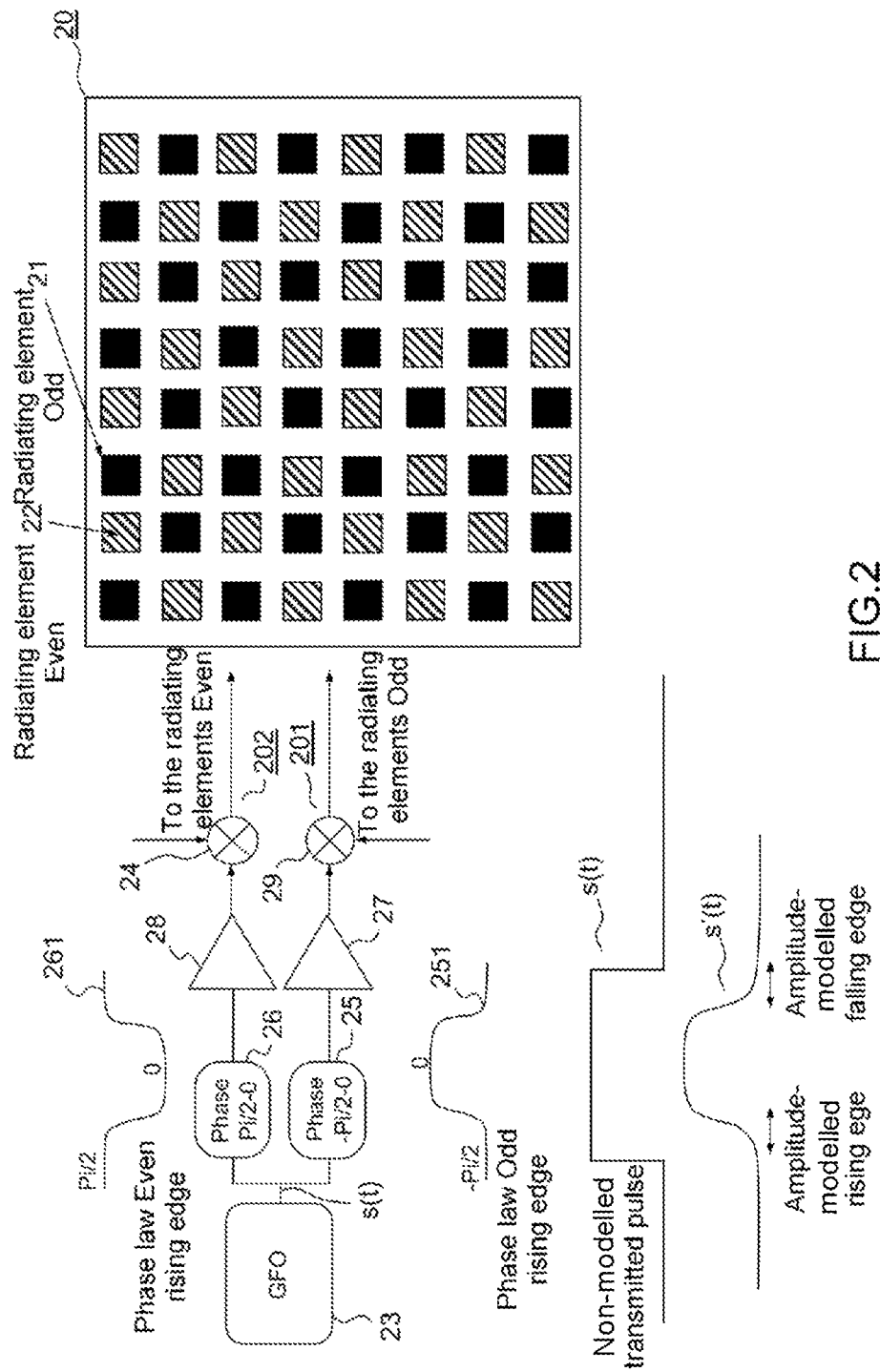
FIG. 2 shows the amplitude modulation principle according to the invention.

FIG. 2 shows the amplitude modulation principle for a pulse wave according to the invention, the result of this modulation being to flatten the rising and falling edges of the transmitted pulse. The antenna 20 made up of radiating elements comprises two sub-arrays:

A first sub-array of odd elements 21 disposed in rows and columns;

A second sub-array of even elements 22 disposed in rows and columns.

The two sub-arrays are interleaved or interwoven in such a way that an odd element is adjacent to even elements only, and that an even element is adjacent to odd elements only.

The first sub-array, made up of odd elements, is fed by signals originating from a first amplification chain 201. The second sub-array, made up of even elements, is fed by signals originating from a second amplification chain 202.

The pulse signal s(t) originates, for example, from a waveform generator 23 and is divided into the two amplification chains. Each chain applies a phase shift 25, 26 according to a given phase law 251, 261, the two phase laws being symmetrical. The phase varies from $-\pi/2$ to 0 for one, and from $\pi/2$ to 0 for the other.

In each chain, the signal is furthermore amplified by an amplifier or amplification module 27, 28. Each chain is terminated by a mixer, the output of each amplifier being connected to an input of a microwave frequency mixer 29, 24, the other input of the mixer receiving the carrier wave of the transmission microwave frequency signal.

The phase-shifted and amplified signal at the output of the first chain thus feeds the first sub-array, made up of the odd elements. The phase-shifted and amplified signal at the output of the second chain feeds the second sub-array, made up of the even elements. The final pulse s(t) is then generated in the antenna and the modulation is effected in the air through recombination of the even and odd signals. An output signal s'(t) amplitude-modelled on the rising edge and the falling edge is obtained. In other words, the combination in the air of the phase-shifted waves in phase opposition produces the desired amplitude modulation. Advantageously, the modulation losses are thus outside the transmission system. It is therefore not necessary to provide a cooling of the heating due to the losses linked to the modulation. Owing to a statistical distribution, the power variations of the different chains can be ignored.

The opposing waveforms thus generated at the outputs of the chains 201, 202 are guided in a known manner to the radiating elements by a specific routing circuit (not shown).

In addition to these phase shifts 251, 261, temporal phase shift laws are applied to each radiating element in a known manner in order to produce an antenna beam sweeping space.

One advantage of the invention is that it is simple to implement. Two phase shifters 27, 28 applying symmetrical phase shifts are sufficient to model the signal.

The diagram shown in FIG. 2 illustrates the principle of the invention. It is purely functional. It is possible, in particular, to implement the phase shifts 251, 261 in the waveform generator 23, the phase shifters 25, 26 then being removed.

Figure 3:
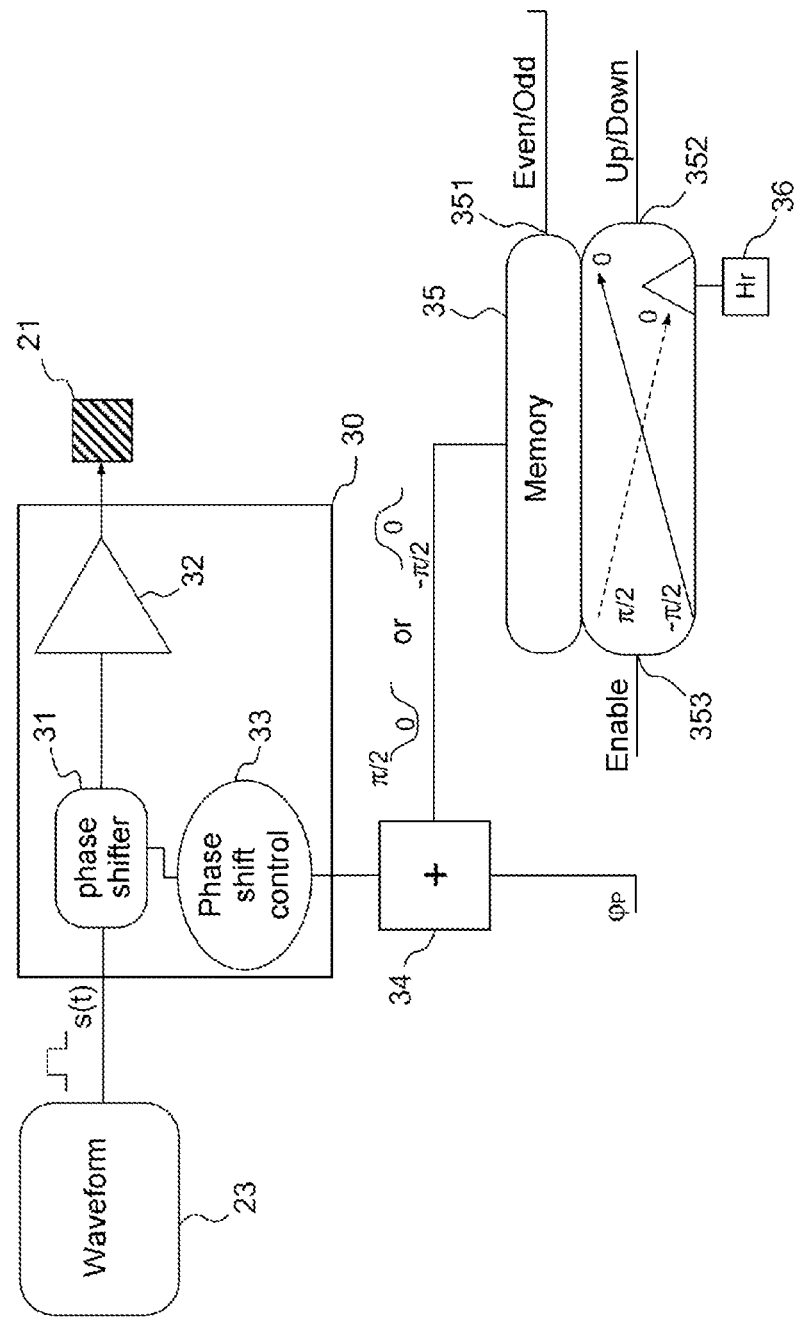
FIG. 3 shows an example embodiment of a transmission system according to the invention.

FIG. 3 shows an example embodiment of a device implementing the invention applied to an active antenna. For greater clarity, only one radiating element 21 of the active antenna is shown.

In order to implement the phase shifts 251, 261, an economical solution consists in using the phase shifter 31 integrated into the transmission and reception modules 30, or pointing modules, of the active antennas, each module feeding one radiating element. In fact, each module contains a phase shifter 31 used for the pointing of the antenna beam. As mentioned above, it is known to form and align the beam by applying a phase law specific to each radiating element.

FIG. 3 therefore shows a pointing module 30 supplying an amplified and phase-shifted microwave frequency pulse signal to the radiating element 21 which is associated with it. The diagram shown in FIG. 3 is a block diagram and does not describe in detail the method of transmitting the microwave frequency signal to the radiating element. This signal is routed to the radiating element via a routing circuit in a known manner. FIG. 3 shows a single radiating element 21 and its associated module, the complete device comprising all of the elements of the two, odd and even, sub-arrays, and their associated modules, i.e. the active antenna. As indicated below, the invention can advantageously be implemented by existing active antennas, subject to minor modifications.

Returning to the diagram shown in FIG. 3, in addition to the phase shifter 31, the module comprises an amplifier 32. The low-level input signal of the module is supplied by a waveform generator 23 which may be common to all of the modules. The phase shifter 31 implements the phase shift intended for the pointing of the beam as a function of a given phase law. This phase law applies a phase shift to each radiating element in a known manner. For this purpose, the module 30 comprises a phase shift control circuit 33 which receives the phase shift value ϕp to be applied. The latter is supplied in coded form by the processing means, more particularly it originates from a pointing table comprising the pointing law(s), and therefore the phase shift law(s), to be applied to all of the radiating elements.

In parallel, the phase shifter applies the phase shift 251, 261 intended to model the pulse signal transmitted to the radiating element.

During the rising edge, it is also necessary to pass through the values from $-\pi/2$ to 0 for the even elements, and from $+\pi/2$ to 0 for the odd elements, by adding the depointing phase shift ϕp corresponding to the intended angle. For this purpose, the phase shift $-\pi/2$ to 0 or $+\pi/2$ to 0, depending on whether the module 30 is associated with an even or odd element, is added to the value ϕp by an adder 34. These phase shift values are digitized and sampled. At the output of the adder 34, the applied phase shift value is supplied to the phase shift control circuit 33. The phase shift instruction is transmitted to the phase shifter 31 which applies it to the signal s(t) entering the module.

A memory 35 comprises the sampled values of the rising edges $-\pi/2$ to 0 and $+\pi/2$ to 0. An even or odd binary information element information present at an input 351 of the memory indicates whether the phase shift $-\pi/2$ to 0 or the phase shift $+\pi/2$ to 0 is to be applied. According to the information, the memory delivers one phase shift or the other. The same memory can therefore be used for all of the modules, regardless of whether they are assigned to an even element or to an odd element. More precisely, a memory is, for example, assigned to each radiating element but, according to whether the radiating element is even or odd, the input 351 is in one state or another, all of the memories having the same content. One memory assigned to all of the odd elements and another assigned to all of the even elements can also be provided.

A binary information element, referred to as Up/Down, present at an input 352 is synchronized with the pulse signal s(t) to be modelled. On the rising edge of the signal s(t), the Up/Down information changes to a state giving the instruction to pass through the values from $-\pi/2$ to 0 or $+\pi/0$, at a clock frequency 36, according to the even/odd information. On the falling edge of the signal s(t), the Up/Down information switches to the other state giving the instruction to pass through the values in the opposite direction. The phase modulation laws 251, 261, as previously described, are thus applied to the rising and falling edges of the signal s(t).

A binary information element, referred to as "Enable", is present on an input 351. In a given state corresponding to the transmission phase of the radiating elements, this information activates the sweeping of the phase shift values, the latter being supplied to the adder 34. In the other state, corresponding to a non-transmission phase, particularly during reception, the memory is inactive and no phase shift is supplied to the adder.

The memory is, for example, downloadable in order to adapt the phase modulation laws according to requirements. In particular, it is possible to adapt the number of phase samples between $-\pi/2$ and 0 or $+\pi/2$ and 0. These sampled values, making up the different corrections of sampled phases between $-\pi/2$ and 0 and $+\pi/2$ and 0, are stored in tables.

These different tables can be used to perform amplitude modulation for amplification classes which do not allow it. This may be useful, in particular, for communication links, or for adapting the power of a detection system as a function of distance.

The clock 36 passes through the phase correction table (between $-\pi/2$ and 0 or between $\pi/2$ and 0) in order to add these phase shift values to the required pointing instruction. The frequency of this clock is dimensioned as a function of the number of points necessary in order to sample the edge. An indicative value could be around 10. The phase law is programmed as a function of the granularity of the phase shifters and the imposed spectral purity requirement. The same applies to the falling edge, although the drop in the feeds is less abrupt and imposes a slope on the falling edge. However, this slope is difficult to control. It is possible, for example, to provide a chronometry, for example, to trigger the clock at the start of the pulse edge, and a signal to cause it to decrease when it is wished to start to model the falling pulse.

More precisely, a counter-based electronic circuit can allow the edges of the pulses to be formatted, thus avoiding unwanted harmonics. These counters in fact control the clock frequency and the sweep frequency for the phase correction tables (sampled phase shift values). The higher or lower speed of the frequency controls the slope.

It is also possible to provide weightings on the phase samples. It is known in the literature that the most effective weightings for reducing the unwanted harmonics are Hamming weightings. However, other weightings such as Gaussian Hann weightings, for example, can be used according to the requirement. In this latter case, it is preferable to integrate the phase modulation law into the pointing table to avoid having to manage two phase shift circuits. As previously described, a fast counter (or a clock) allows, for example, the memory 35 to be scanned with an indexation allowing the phase to be varied from $-\pi/2$ to 0 and from $\pi/2$ to 0 for the even location and for the odd location respectively. The clock must be fast in order to generate the desired Hamming weighting, the speed being a function of the number of phase shift points to be generated. The order of magnitude being to sample the edges of the pulse at least 10 times in order to flatten them by 10% of the width of the pulse s(t).

The invention advantageously allows the constraints linked to the linearity requirements to be overcome. It allows the shape of the transmitted pulse to be managed, regardless of the chosen amplification classes, the only constraint being that the transmission and reception module amplifiers 32 are of the same type, which is normally the case, since these modules are standardized. Finally, the invention enables evaluation of the losses linked to the modulation outside the radar, directly at the antenna output.

The invention claimed is:

1. A method for modulating a microwave frequency pulse wave, comprising:
providing an antenna configured to transmit the wave, wherein the antenna comprises an array of radiating elements,
transmitting two pulse waves each modulated by a phase shift law known as modulation phase shift, wherein phase shifts of the two pulse waves are in opposition,
transmitting (i) a first wave by a sub-array of radiating elements referred to as odd and (ii) a second wave by a second sub-array of radiating elements referred to as even, wherein the two sub-arrays are interleaved, the transmitted wave being the combination of said first wave and said second wave, obtaining said two waves form the same pulse signal (s(t)), said signal being modulated by a first modulation phase shift for the odd radiating elements and by a second modulation phase shift for the even elements, applying said first modulation phase shift to the rising edge of the pulse by varying form $-\pi/2$ to 0 and to the falling edge by varying from 0 to $-\pi/2$; and applying said second modulation phase shift to the rising edge of the pulse by varying from $\pi/2$ to 0 and to the falling edge by varying from 0 to $\pi/2$.

2. The method according to claim 1, wherein, for each radiating element, a pointing phase shift ($\varphi_P$), specific to each radiating element, is added to the modulation phase shift.

3. The method according to claim 1, wherein, a transmission and reception module being connected to each radiating element, said module comprising a phase shifter applying said pointing phase shift, said phase shifter furthermore applies the modulation phase shift.

4. The method according to claim 1, wherein a Hamming weighting is applied to said pulse waves.

5. The method according to claim 1, wherein a Gaussian Hann weighting is applied to said pulse waves.

6. A transmission system comprising an antenna made up of an array of radiating elements, wherein it carries out the method according to claim 1, said system comprising a transmission and reception module connected to each radiating element, said module comprising a phase shifter applying a phase shift controlled by a control circuit to the input signal (st)), said modulation phase shift laws are stored in the form of samples in a memory, said phase shift samples being supplied to said control circuit at the frequency of a clock.

7. The transmission system according to claim 6, wherein said input signal (s(t)) is supplied by a waveform generator common to all of the radiating elements.

8. The transmission system according to claim 6, wherein, for each radiating element, an adder summates the phase shift samples delivered by said memory with the pointing phase shift ($\varphi_P$), the resulting phase shift being supplied to said control circuit.

9. A radar, comprising a transmission system according to claim 6.

10. The method according to claim 1, wherein the first and second modulation phase shifts are different from one another.

11. The method according to claim 1, wherein the interleaving of the two sub-arrays comprises individually alternating odd and even subarrays both horizontally and vertically throughout a plane of the antenna.

12. The method according to claim 1, wherein the phase shifts of the two pulse waves cause destructive interference.

* * * * *